United States Patent [19]
Bourgeois

[11] Patent Number: 5,138,515
[45] Date of Patent: Aug. 11, 1992

[54] PULSE-CONTROLLED GATE CIRCUIT WITH PROTECTION AGAINST SHORT-CIRCUIT

[75] Inventor: Jean-Marie Bourgeois, La Bedoule, France

[73] Assignee: SGS-Thomson Microelectronics.A., Gentilly, France

[21] Appl. No.: 690,769

[22] Filed: Apr. 24, 1991

[30] Foreign Application Priority Data

Apr. 25, 1990 [FR] France .................. 90 05692

[51] Int. Cl.[5] ............................................. H02H 9/02
[52] U.S. Cl. ............................... 361/18; 361/56; 361/93; 307/270; 307/246; 307/576; 323/289; 323/290
[58] Field of Search ............... 361/18, 56, 91, 93, 361/111, 152, 153; 307/246, 270, 571, 572, 573, 574, 575, 576; 323/289, 290

[56] References Cited

U.S. PATENT DOCUMENTS

| | | | |
|---|---|---|---|
| 4,500,802 | 2/1985 | Janutka | 307/570 |
| 4,691,129 | 9/1987 | Einzinger et al. | 307/270 |
| 4,928,053 | 5/1990 | Sicard et al. | 323/289 |

FOREIGN PATENT DOCUMENTS

8801996 8/1988 Netherlands .

OTHER PUBLICATIONS

Patent Abstracts of Japan, vol. 11, Number 92 (E-491) [2539], Mar. 24, 1987 (61-242416).

*Primary Examiner*—A. D. Pellinen
*Assistant Examiner*—C. S. Schultz
*Attorney, Agent, or Firm*—Lowe, Price, Le Blanc & Becker

[57] ABSTRACT

A pulse-controlled circuit for an insulate gate power transistor (Tp) comprises an auxiliary MOS transistor (T1) connected between the gate and a reference terminal of the power transformer in parallel with a pulse transformer secondary (W2). This circuit comprises two controlled unidirectionally conductive paths in parallel (D1, M1; D2, M2) between one terminal of the transformer secondary and the auxiliary transistor gate, these paths being alternatively rendered conductive when a positive or negative pulse is applied to the secondary of the transformer.

7 Claims, 2 Drawing Sheets

PULSE-CONTROLLED GATE CIRCUIT WITH PROTECTION AGAINST SHORT-CIRCUIT

BACKGROUND OF THE INVENTION

The present invention relates to the control of power transistors with capacitive control such as MOS transistors and insulated gate bipolar transistors (IGBT).

More particularly, the invention aims at achieving a control system wherein the control circuit is insulated from the power circuit, a short pulse being liable to switch on the power transistor until the occurrence of a short pulse with an opposite polarity for turning off this power transistor.

An object of the invention is to provide a particularly simple circuit, liable to operate at a low frequency without limitation of the duty cycle and which allows rapid switching of the power transistor.

Another object of the invention is to provide a control circuit comprising means for interrupting the conduction of the power transistor in case of short-circuit in the load.

A further object of the invention is to provide a control circuit comprising means for supplying to the portion of the control circuit insulated from the power circuit an indication that a short-circuit has occurred in the load.

SUMMARY OF THE INVENTION

To achieve these objects and others, the invention provides a pulse-controlled circuit for an insulated gate power transistor comprising a first gate terminal and a second reference terminal, an auxiliary MOS transistor being connected between the first and second terminals, a pulse transformer secondary, having third and fourth terminals, being connected to the first and second terminals. This circuit comprises a first diode, connected between the second and fourth terminals, and two controlled unidirectionally conductive parallel paths between the fourth terminal and the auxiliary transistor gate, one of these paths being rendered conductive when a positive or negative pulse is applied to the transformer secondary. Each path comprises a second and a third diode, respectively, in series with a first and a second MOS transistors, the two diodes being anti-parallel connected, the two MOS transistors being of the opposite channel type conductivity, their gates being interconnected and coupled to the third terminal.

According to an aspect of the invention, means are provided for interrupting the conduction of the power transistor when its load is being shorted, these means comprising a path in parallel with the first diode, this path being switched on when the current in the power transistor exceeds a predetermined intensity or when the forward voltage drop in the power transistor exceeds a predetermined value.

According to an aspect of the invention, means for inhibiting the switching-on of said path during charging of the power transistor gate are provided.

BRIEF DESCRIPTION OF THE DRAWINGS

The foregoing and other objects, features and advantages of the invention will be apparent from the following detailed description of preferred embodiments as illustrated in the accompanying figures wherein.

DETAILED DESCRIPTION OF THE INVENTION

Figure 1:
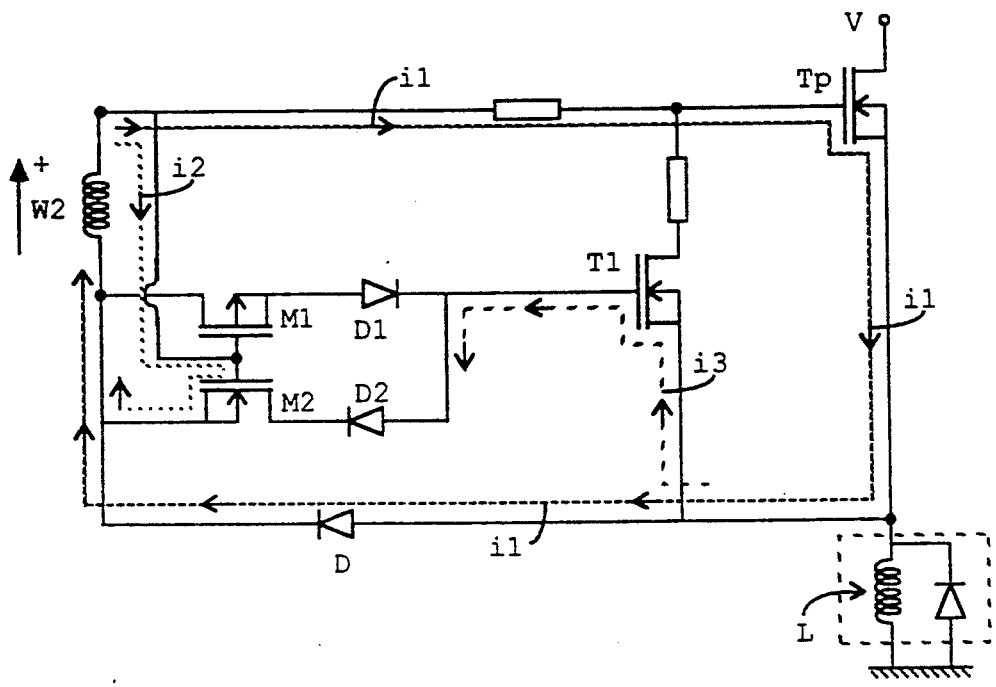
FIGS. 1 and 2 show a same embodiment of the invention, during the application of a switching on order and of a switching off order, respectively.
Figure 2:
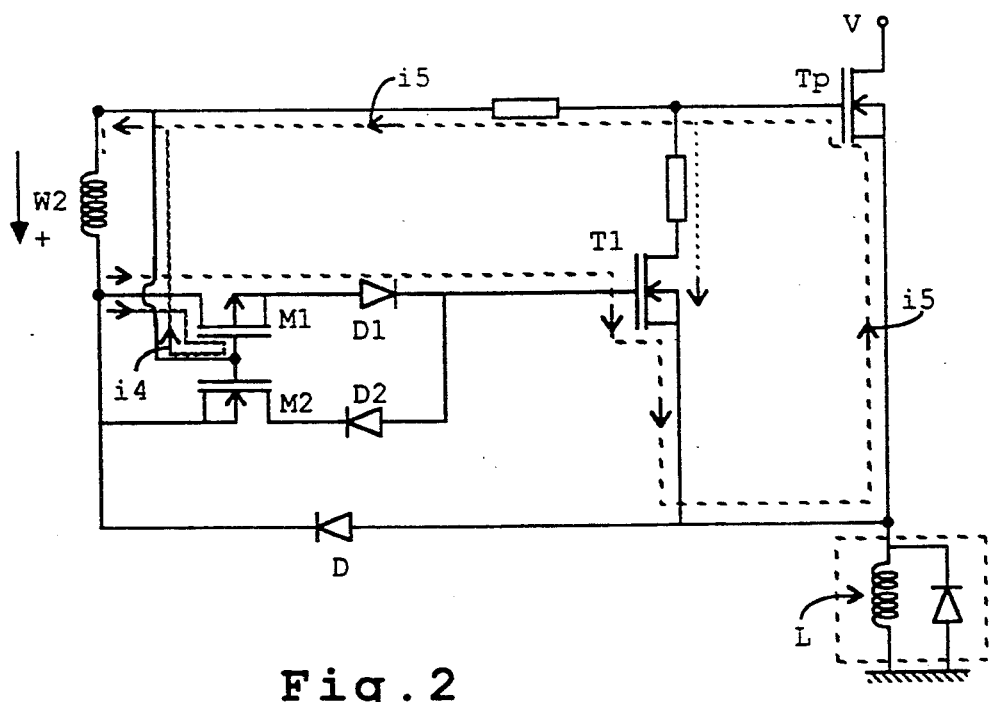

FIGS. 1 and 2 show a preferred embodiment of the invention. Generally, the invention relates to the switching of a power transistor or main transistor Tp, a first terminal of which is coupled to a supply voltage V and the other main terminal, or reference terminal, is coupled to a load L, which is commonly an inductive load in parallel with a free wheel diode.

According to the invention, means are provided to switch on transistor Tp when a pulse with a first polarity arrives at a secondary winding W2 of a transformer and to switch off this main transistor Tp when a pulse of a second polarity is applied to winding W2. An auxiliary transistor T1 is connected between the gate and reference electrode of transistor Tp. The conduction state of transistor T1 is controlled so as to be complementary to that of transistor Tp. Thus, when transistor Tp is off, transistor T1 is on to evacuate all parasitic loads liable to occur at the gate of transistor Tp and, when transistor Tp is on, transistor T1 is off to avoid discharging the gate of transistor Tp.

Moreover, the invention provides means for ensuring an unidirectional flow of current during a turn on process for charging the gate of transistor Tp and uncharging the gate of transistor T1, and so that the gates remain in that state until an opposite polarity pulse occurs.

Those skilled in the art will be able to devise various means for transmitting unidirectional pulses occurring at the secondary W2. A preferred embodiment of means for ensuring unidirectional current flows is illustrated in FIGS. 1 and 2. The circuit comprises a diode D connected between the reference terminal of transistor T1 and the lower terminal of the secondary winding W2. In addition, this lower terminal of winding W2 is coupled to the gate of transistor T1 through two paths in parallel, each comprising a diode having a polarity opposite to that of the diode of the other path, D1 and D2, respectively. Each diode is in series with a switch, the two switches being oppositely controlled, as later explained.

In the embodiment shown, the power transistor Tp is an N-channel enhanced MOS transistor, as well as the auxiliary transistor T1. In the two parallel paths, the first controlled switch is a P-channel MOS transistor M1 and the second controlled switch is an N channel MOS transistor M2. The gates of transistors M1 and M2 are interconnected and coupled to the upper terminal of the secondary winding W2. Diode D1 is biased so as to allow a positive current to flow to the gate of transistor T1. Diode D2 is reversely biased. Diode D is biased so as to allow a positive current to flow to the lower terminal of the secondary winding W2.

In the preferred embodiment shown in FIG. 1, a turn on order for transistor Tp corresponds to the application of a positive pulse to the secondary winding W2, as shown. When this pulse occurs, a current $i_1$ flows from the upper terminal to the lower terminal of winding W2 passing through the gate/source capacitance of transistor Tp and diode D. A current $i_2$ flows through the gate/source capacitance of transistor M2 and switches it on. (Simultaneously, transistor M1 is turned off). Moreover, a current $i_3$, the path of which is only partially shown, discharges the gate/source capacitance of the auxiliary transistor T1. (Current path $i_3$ constitutes a shunt, passing through diode D2 and transistor M2 of current path $i_1$ flowing through diode D).

Furthermore, due to the provision of the various diodes illustrated, transistors Tp and T1 remain in the state they were at the end of the application of the control pulse.

FIG. 2 shows the application of a switching-off order of the main transistor Tp. To switch off transistor Tp, a negative pulse is applied to winding W2. Thus, a first current $i_4$ turns on transistor M1 (simultaneously transistor M2 is turned off). As soon as transistor M1 is conductive, a current $i_5$ can flow from the lower terminal of the secondary winding W2 through transistor M1, diode D1, the gate/source capacitance of transistor T1, the gate/source capacitance of transistor Tp, to the upper terminal of the secondary winding W2. Thus, simultaneously the gate of transistor T1 is charged and the gate of transistor Tp is discharged, whereby transistor T1 is turned on and transistor Tp off. It will be noted that once transistor T1 is turned on, the gate of transistor Tp can finish to discharge directly through transistor T1 and the impedance shown in series.

The described circuit constitutes a specific embodiment of a pulse controlled circuit for a power transistor, illustrated as being an N channel MOS transistor but liable to be also another type of MOS transistor or an insulated gate bipolar transistor (IGBT). An advantage of this pulse controlled circuit is its simplicity and the small number of its components. Thereby, it is possible to integrate this circuit on the chip comprising the power transistor. (The secondary winding W2 only being external to the integrated circuit).

A further advantage of the above described circuit lies in the fact that it can be interconnected with a system for detecting load shorts, interrupting the conduction of the power transistor in case of short-circuit detection and signalling the occurrence of such short-circuit. It will be understood, as explained hereunder, that the conduction interruption function during a short circuit must be distinguished from the short-circuit signalling function. In fact, there are circuits for automatically interrupting conduction in case of short circuit without indication of the occurrence of such an interruption. With such circuits, if the power transistor is designed to operate periodically, for example in case of bridge-connections or converter circuits, at each cycle, a start of conduction will be followed by an interruption in case of short-circuit in the load. It is then desirable to indicate on the side of the transformer primary the presence of such a short-circuit to stop the order so as to avoid overheating and to improve the life time of the power components.

FIG. 3 shows again the circuit components already illustrated in FIGS. 1 and 2, namely, transistor Tp, auxiliary transistor T1, load L, diode D, diode D1 and P-channel enhanced MOS transistor M1, diode D2 and N-channel enhanced MOS transistor M2, and secondary winding W2. A low value resistor $r_m$ is added to the circuit, in series between the load and the reference electrode of transistor Tp. The voltage across resistor $r_m$ controls a switch, formed in the particular illustrated case by an N-channel enhanced MOS transistor M3, the transistor being arranged in series with a diode D3, this unit being in parallel on diode D, diodes D3 and D being anti-parallel connected. It will be noted that, if transistor M3 is a bipolar transistor, the provision of a diode D3 is not necessary, this diode being present only because, in technologies commonly used for achieving a MOS transistor such as transistor M3, there is in parallel on this transistor a diode (not shown) having the same polarity as diode D but, this diode (not shown) being slow, it is not desirable to use it.

When the current in the load and the voltage across resistor $r_m$ exceed a predetermined threshold, transistor M3 becomes conductive and the gate of transistor Tp is discharged by a path passing through the secondary winding W2, diode D3 and switch M3, and resistor $r_m$. Transistor M3 being blocked in the absence of short-circuit, the parallel connection of diode D3 and transistor M3 does not affect the switching off and on operation of the circuit, as above discussed.

On the other hand, in case of short-circuit, the gate of the power transistor Tp is not discharged during the occurrence of a pulse switching transistor Tp on, but immediately after such pulses. Moreover, a circuit masking the voltage across the terminals of resistor $r_m$ during the charging of the gate capacitance of transistor Tp is provided. In the embodiment shown, this masking circuit of resistor $r_m$ comprises, in parallel with resistor $r_m$, the series connection of an N channel MOS transistor M4, a resistor R4 and a diode D4. The gate of transistor M4 is coupled through a transistor M5 to the upper terminal of the secondary winding W2 and through a resistor R6 to the reference terminal of transistors T1 and Tp. The gate of transistor M5 is coupled to the gate of transistor Tp and an impedance R5 is arranged between the gate and source of transistor M5. Thus, as soon as a charging current of the gate capacitance of transistor Tp flows from the upper terminal of winding W2 to the gate of transistor Tp, that is, during a turn on order, a voltage grows across resistor R5 and a negative voltage appears at the gate of the P-channel transistor M5 which becomes conductive and causes current to flow through resistor R6 and transistor M4 to be turned on. This causes masking of resistor $r_m$ during passage through transistor Tp of current peaks resulting from the conduction of free wheel diodes in parallel on the load during the switching on of transistor Tp. As soon as the charge of the gate capacitance of transistor Tp is completed, transistors M5 and M4 are blocked and the voltage across resistor $r_m$ controls transistor M3, as above described, for causing the gate of transistor Tp to be discharged.

Figure 3:
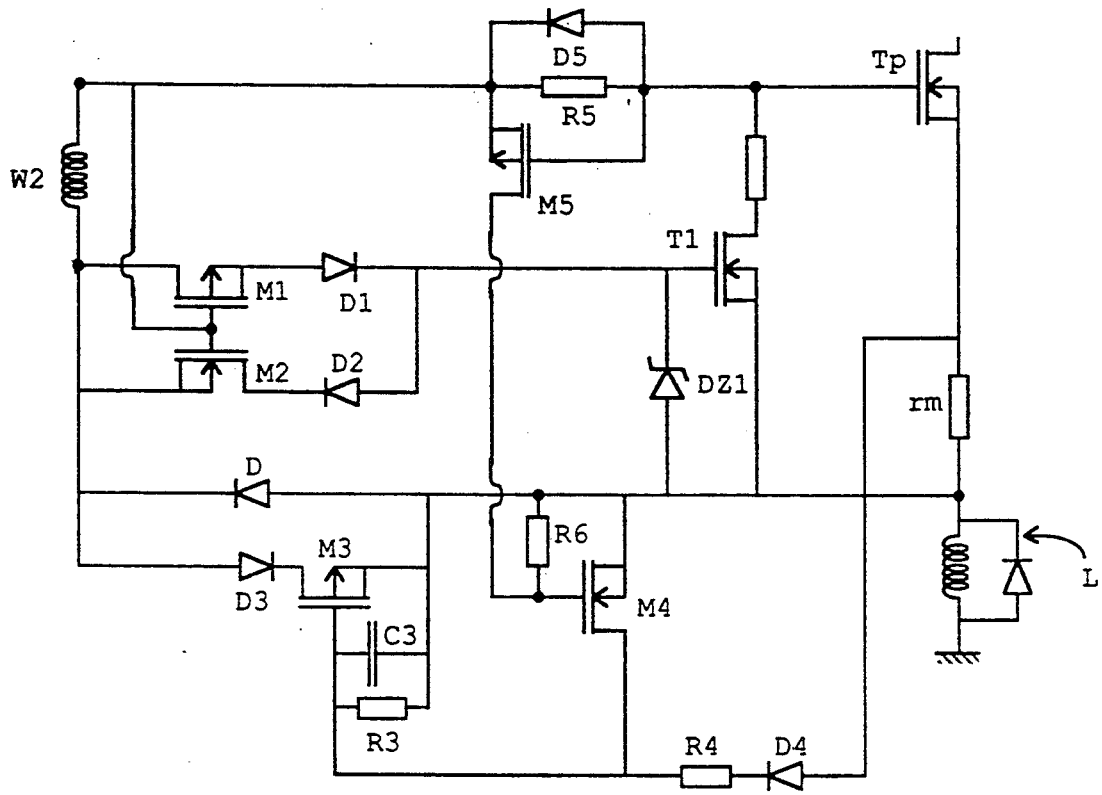
FIG. 3 shows a circuit identical to the one of FIGS. 1 and 2, with additional means for interrupting the conduction of the main transistor during shorting.

Moreover, FIG. 3 shows various additional components designed to improve the operation of the circuit. Among these components, there is a zener diode Z1 between the gate and source of transistor T1. This zener diode Z1 is mainly intended to avoid applying too high voltages on this gate at the beginning of switching off pulses. In parallel, between the gate and source of transistor M3, a capacitor C3 and a resistor R3 are provided. The assembly of capacitor C3, resistor R3 and diode D4 is intended to ensure the presence of a time constant to maintain the MOS transistor M3 on long enough after detection of an overvoltage so as to completely discharge transistor Tp. A diode D5 is in parallel on resistor R5 to decrease the impedance of the discharging path of the gate of transistor Tp.

Thus, the circuit of FIG. 3 detects, with resistor $r_m$, the occurrence of load short circuit, and discharges the gate capacitance of transistor Tp through diode D3, switch M3 and the secondary winding W2 as soon as overvoltage occurs. The discharge of the gate capacitance of transistor Tp causes the passage of a negative current pulse in the secondary winding W2. If this negative pulse is detected at the primary, the occurrence of short-circuit will be signalled and it will therefore be possible to activate an alarm, to stop sending switching-on orders and to confirm the off state by a switching-off order.

Another conventional circuit for detecting short-circuit can be used for controlling M3. This circuit controls the voltage at the collector of transistor Tp instead of controlling current in $r_m$. In case of short-circuit, the collector/emitter voltage of Tp is abnormally high and can be used by any known means to activate the gate of M3 at the end of the switching on pulse, and to cause the discharge of Tp in W2 and the activation of an alarm circuit.

Figure 4:
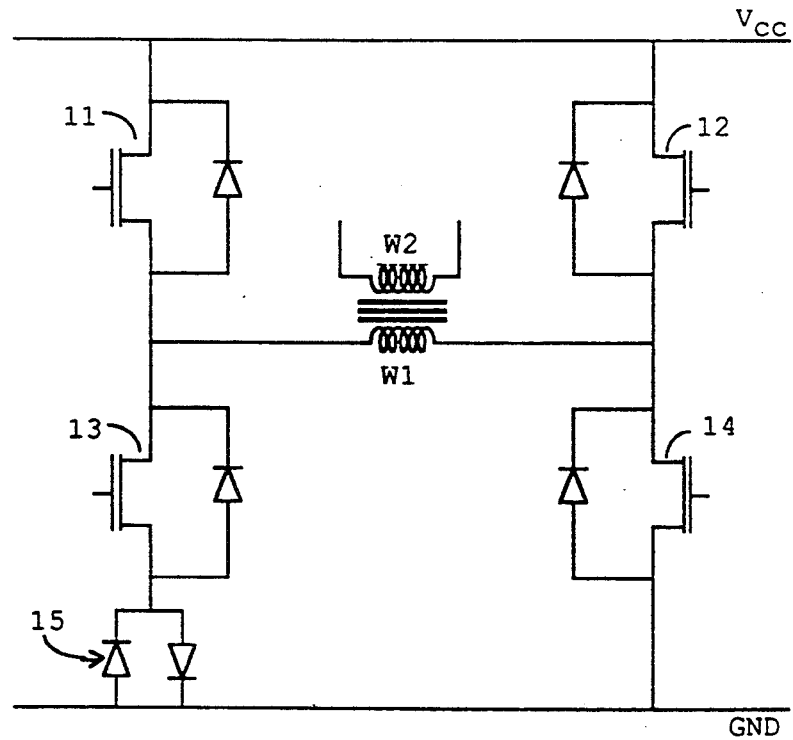
FIG. 4 shows an exemplary connection of a control circuit associated with the primary of a pulse transformer used according to the invention.

FIG. 4 shows an exemplary control circuit for the primary winding W1 associated with winding W2, this circuit detecting the occurrence of a negative current pulse at winding W2 whereas transistor Tp is normally in the conductive state, this current pulse providing a corresponding negative pulse at winding W1.

The control circuit of the primary winding W1 shown in FIG. 4 is a bridge connection comprising four legs 11-14 each comprising a switch in parallel with a return diode. A first bridge diagonal is coupled between a supply source VCC and ground GND. The primary winding W1 is placed on the second bridge diagonal. With the notations of the figure, a pulse of a first polarity, resulting from the switching on of switches 12 and 13, corresponds to a switching on pulse, and a pulse of a second polarity, resulting from the switching on of switches 11 and 14, corresponds to the supply of a switching off pulse. In this case, during the on state, after supply of a first polarity pulse, switches 13 and 14 have to be on, switches 11 and 12 being off. It is in this state that it is desired to detect the possible occurrence of a negative pulse at winding W1, resulting from a load short-circuit and from discharging of the gate of transistor Tp. For this purpose, an impedance 15, constituted for example by two anti-parallel diodes, is arranged in the leg of the bridge comprising switch 13. Then, it will be easy to conventionally determine the occurrence of a determined polarity voltage, corresponding to said negative pulse at winding W1, appearing at impedance 15. This detection can be used for controlling an alarm and confirming the off state of the power transistor.

Those skilled in the art will be able to devise various variants of the circuits according to the invention, the main point being that the functions indicated for each circuit be complied with.

In the claims, the verb "to couple" is used to designate a connection between two components with possible interposition of other components, and the verb "to connect" is used to designate a connection that can be direct.

I claim:

1. A pulse-controlled circuit for a power transistor with an insulated gate, having a first gate terminal and a second reference terminal, comprising
   an auxiliary MOS transistor connected between said first and second terminals,
   a pulse transformer secondary having third and fourth terminals coupled to the first and second terminals,
   a first diode connected between said second and fourth terminals, and
   two controlled unidirectionally conductive paths in parallel, between said fourth terminal and said auxiliary transistor gate, said paths being alternatively rendered conductive when a positive or negative pulse is applied to said secondary of the transformer,
   wherein said paths respectively comprise a second and a third diode in series with a first and a second MOS transistor, said second and third diodes being anti-parallel connected, said MOS transistors being of the opposite channel-type, their gates being interconnected and coupled to said third terminal.

2. A control circuit according to claim 1, further comprising means for interrupting the conduction of the power transistor when its load is shorted, wherein said interruption means comprise a path in parallel with said first diode, said path being switched on when the current in the power transistor exceeds a predetermined intensity or when the voltage drop at the conductive state in said power transistor exceeds a predetermined value.

3. A control circuit according to claim 2, wherein said path comprises a fourth diode reversely connected with respect to said first diode and a third MOS transistor, the gate of which is connected to said second terminal, said second terminal being connected to a load through a measure resistor.

4. A control circuit according to claim 3, comprising means for inhibiting the conduction of said path during charging of the power transistor gate capacitance.

5. A control circuit according to claim 4, wherein said inhibition means comprise a fourth and a fifth MOS transistor, said fourth MOS transistor being connected to the terminals of said measure resistor through a further resistor, said fifth MOS transistor being connected between the gate of said fourth MOS transistor and said third terminal, the gate of said fifth MOS transistor being connected to said first terminal and an impedance being connected between said first and third terminals.

6. A control circuit according to claim 2, wherein the primary of said transformer is associated with a circuit for detecting the passage of a pulse discharging the gate/electrode capacitance of the power transistor Tp in the secondary of the transformer after the switching on of said path.

7. A control circuit according to claim 6, wherein the primary of the transformer is energized by a bridge connection, said detection circuit being associated with a leg of the bridge which is at the conductive state once the power transistor has been controlled through a pulse to be in the conductive state.

* * * * *